United States Patent
Mallett

(10) Patent No.: US 7,474,515 B2
(45) Date of Patent: Jan. 6, 2009

(54) CRYOGENIC MAGNET CONTROL SYSTEM

(75) Inventor: Michael John Disney Mallett, Witney Oxon (GB)

(73) Assignee: Siemens Magnet Technology Ltd, Witney (DE)

( * ) Notice: Subject to any disclaimer, the term of this patent is extended or adjusted under 35 U.S.C. 154(b) by 0 days.

(21) Appl. No.: 11/829,174

(22) Filed: Jul. 27, 2007

(65) Prior Publication Data

US 2008/0049371 A1 Feb. 28, 2008

(30) Foreign Application Priority Data

Jul. 27, 2006 (GB) .................... 0614934.8

(51) Int. Cl.
*H01H 1/00* (2006.01)
(52) U.S. Cl. ......................... 361/19; 335/216
(58) Field of Classification Search .............. 361/19, 361/141; 335/216, 301
See application file for complete search history.

(56) References Cited

U.S. PATENT DOCUMENTS

| 5,329,266 A | 7/1994 | Soeldner et al. |
| 5,668,516 A | 9/1997 | Xu et al. |
| 5,739,997 A * | 4/1998 | Gross ........................... 361/19 |
| 6,147,844 A * | 11/2000 | Huang et al. ................... 361/19 |
| 6,507,259 B2 | 1/2003 | Westphal et al. |

OTHER PUBLICATIONS

Patent Abstracts of Japan Publication No. 04134808 A for Japanese Application 02255104, Aug. 5, 1992.
Patent Abstracts of Japan Publication No. 61093604 A, for Japanese Application No. 59214214, Dec. 5, 1986.

* cited by examiner

*Primary Examiner*—Michael Sherry
*Assistant Examiner*—Danny Nguyen
(74) *Attorney, Agent, or Firm*—Schiff Hardin LLP

(57) ABSTRACT

A cryogenic magnet control system has a number of magnet coils each formed by superconductive material wound on a former and a supply for energizing the magnet coils to generate an operational magnetic field of predetermined strength and homogeneity, wherein each former also supports control wineings of a non-superconductive material provided as overbindings upon the magnet.

6 Claims, 2 Drawing Sheets

CRYOGENIC MAGNET CONTROL SYSTEM

BACKGROUND OF THE INVENTION

1. Field of the Invention

The present invention relates to control systems for superconducting magnets, and particularly though not exclusively to such systems for promoting the safe operation of magnets utilized for the examination of patients in magnetic resonance imaging (MRI) scanners.

2. Description of the Prior Art

Superconducting magnet systems typically are formed by coils of superconductive material wound on suitable formers. Such systems are known to be vulnerable to so-called quenching, a sudden and irreversible collapse of the magnetic field arising from any event which can cause localized disturbance of the superconductive state, leading to the creation of electrical resistance at the site of the disturbance, and a rapid build-up of localized heating which exacerbates the resistance. It is well known that, in order to reduce the risk of localized, possibly permanent, damage to the magnet coils it is necessary, shortly after the commencement of a quenching event, to distribute the quench as widely as possible through the coils of the system. This is typically done by providing heaters, located adjacent the magnet coils, which are automatically energised in the event of a quench to raise the resistance of the coils generally.

Aside from the risk of irreversible damage to the coils during a quench, such events also give rise to safety concerns, including the need to rapidly vent boiled-off coolant vapor, and the need to contain powerful stray magnetic fields generated by the rapid collapse of the MRI scanning field generated by the quenching coils. The vapor control systems are well known, and are not addressed by this invention. As regards the containment of the powerful stray fields, this is typically implemented by means of strategically placed "quench bands", which are continuous bands of highly conductive material, placed to surround one or more of the magnet coils, typically on their outer surfaces. During a quench event, such quench bands support large eddy currents designed to cancel the field expansion caused by the eddy currents in the rest of the magnet.

It is to be noted that quench events are not always accidental. There are occasions when it is necessary to deliberately quench the magnetic field in order (for example) to remove the magnetic field rapidly to accommodate health and safety requirements, and references to quenches and quenching herein should accordingly be construed to encompass both deliberately and accidentally induced quench events.

A further difficulty associated with superconductive magnetic coil systems is that the superconducting wire and the material of the former typically have very different mechanical properties; notably in respect of their coefficients of thermal expansion. A typical superconducting wire has a coefficient of expansion dominated by the copper matrix of the wire, whereas the former material may typically be aluminium, steel or some form of composite material with a coefficient of thermal expansion different from that of copper. This mismatch of thermal expansion coefficients can cause the superconducting windings to become loose on the magnet former when the magnet is cooled down from its manufacturing temperature (typically 300K) to its operating temperature (typically 4K). A further change in the relative radial dimensions of the coils with respect to the former will happen due to the Lorentz force on the coils when the magnet is energized, which will typically cause positive (expansive) hoop stress in the magnet coils, again loosening the coils on the former.

It will be appreciated that looseness of fit between the coils and their formers can increase the vulnerability of the magnets to mechanical shock, which may promote quenching. It may also cause the homogeneity of the generated magnetic field to be compromised owing to the coils no longer retaining their design dimensions or position. Such problems are usually addressed by restraining the coils from significant motion relative to the former, either by the provision of coil clamps or by over-binding the coils with one or more layers of a typically non-superconducting wire, usually aluminium, which tends to tighten onto the former during cool down, due to its higher coefficient of thermal expansion compared to that of the superconducting wire. Such an over-binding can also compensate for expansion caused by hoop stress associated with the Lorentz forces in the magnet coils.

The above-recited three problems; namely the dissipation of quench events, the containment of stray fields on rapid collapse of the main field associated with the superconductive coils and the retention of fit of coils to formers are all typically addressed individually.

SUMMARY OF THE INVENTION

An object of this invention to provide an integrated control system for mitigating three problems.

The above object is achieved in accordance with the present invention by a cryogenic magnet control system having a number of magnet coils each formed by windings of superconductive material wound on a former and a supply that energizes the magnet coils to generate an operational magnetic field of predetermined strength and homogeneity, and wherein each former also supports control windings of a non-superconductive material that are provided as over-bindings on the magnet coils. Each control winding is formed of a material having a coefficient of thermal expansion that is greater than the coefficient of thermal expansion associated with that magnet coil, so as to restrain differential expansion between the magnetic coil and the former thereof. The control windings are configured and dimensioned so as to produce eddy currents that oppose magnetic field expansion caused by eddy currents in the remainder of the magnet, as are associated with quenching of the operational magnetic field. For at least some of the magnet coils, magnet coils, andthe respective control windings of these magnetic coils are electrically connected together, so that the control windings of a subset of a magnet coils are electrically interconnected. A control unit is connected to these interconnected control windings to supply electrical current to those control windings in response to the onset of a quench, thereby automatically providing localized heating to those magnet coils in response to the quench, so as to distribute the quench among the subset of the magnet coils.

DESCRIPTION OF THE PREFERRED EMBODIMENTS

Figure 1:
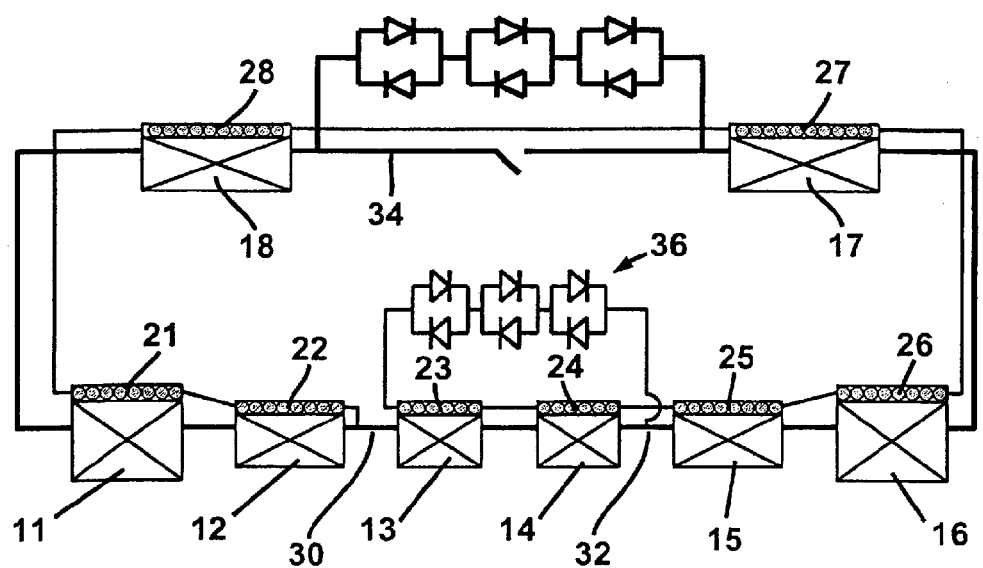
FIG. 1 shows schematically and in cross-sectional view a portion of a coil arrangement incorporating a control system in accordance in one embodiment of the invention.

Referring now to the drawing, which has rotational symmetry about the axis line X-X, for example the longitudinal axis of a magnetic resonance (MR) or MRI scanning apparatus, a superconducting magnet system typically comprises a number of discrete magnet coils 11 to 18, wound from superconductive wire; each coil such as 11 being supported on a respective former (not shown). It will be appreciated that the particular layout of magnets shown in the drawing is provided by way of example only and that accordingly, other layouts and configurations may be used without departing from the scope of the invention. Moreover, the functions of the various component magnets in the layout shown, and the magnitudes of the fields which they typically generate are well known to those skilled in the art, and will not be further described herein.

As mentioned previously, a mechanical problem associated with such constructions arises because, for each magnet 11 to 18, the superconductive wire and the material of the former which supports it typically have significantly different mechanical properties; particularly as regards their coefficients of thermal expansion. A typical superconductive wire has a coefficient of expansion dominated by the copper matrix of the wire, whereas the former material is typically aluminium, steel or some form of composite material with, in any event, a coefficient of thermal expansion different from that of copper.

This difference in coefficients of thermal expansion causes the superconductive windings to become loose on their magnet formers when he magnet system is cooled down from its manufacturing temperature (typically 300K) to its operating temperature (typically 4K).

A further change in the relative radial dimensions of the coils with respect to their supporting formers occurs, in operation of the magnet system, due to the Lorentz force on the coils when the magnet is energized. This Lorentz force typically causes positive (expansive) hoop stress in the magnet coils, further loosening the superconductive windings relative to the supporting formers.

Loosening of the fit between a magnet coil such as 11 and its supporting former can (as previously mentioned) promote a sensitivity of the magnet system to shocks induced by mechanical or other forces, whereby local displacement occurs, causing localized and transient disturbances to the superconductive state to occur in the coil. It can also cause a degrading effect on the homogeneity of the magnetic field owing to the magnet coils no longer being of their intended dimension or position. Accordingly, this embodiment of the invention provides a respective control winding 21 to 28 associated with each magnet coil 11 to 18; each control winding being wound in several layers around the outside of its respective magnet coil.

Each control winding 21 to 28 is formed of a material such as aluminium which has a coefficient of thermal expansion which tends to cause a reduction in the radius of the control winding with reducing temperature greater than the corresponding reduction in the radius of the associated magnet coil. Thus, each control winding such as 21 is effective to tighten its respective magnet coil, such as 11, onto its former when the temperature is reduced to the operational range of the magnet system.

Furthermore, the superconducting magnet system as a whole is typically surrounded by a highly conductive thermal radiation shield, usually manufactured from aluminium and held at a temperature typically in the range of 20K to 80K. During a magnet quench event, when the superconducting coils 11 to 18 become resistive, the magnetic energy is rapidly dissipated, causing a rapid decay of the magnetic field. This rapid change in the magnetic field induces, in conducting surfaces in the magnet structure, eddy currents which can cause the static magnetic field profile to expand, or burst, during a quench event. Consequently, the high magnetic field can rapidly expand in volume, potentially causing damaging side effects to persons with magnetic sensitive pacemakers and to surrounding equipment.

In order to address this problem, it is conventional to provide so-called "quench bands". These are continuous bands of highly conductive material, typically copper, disposed to surround one or more of the magnet coils, typically on their outer surfaces. During quench events, the quench bands support large eddy currents which are in opposition to the eddy currents generated in the other conductive surfaces inside the magnet system, typically the thermal radiation shield. The compensating eddy currents in the quench bands are designed to cancel the field expansion caused by the eddy currents in the rest of the magnet. This solution, however, requires the addition of extra components beyond those used to address the aforementioned problems associated with the loosening of coils 11 to 18 on their supporting formers.

In accordance with an embodiment of the invention, the control windings 21 to 28 used to over-bind respective magnet coils 11 to 18 are strategically dimensioned and configured, for example by choice of the number of turns comprised in each control winding 21 to 28 and/or the material used for the control winding and/or its thickness, to support eddy currents similar to those supported, in a conventional construction, by the aforementioned quench bands. By this means, an integrated approach, usefully employing common components, is utilized to address both problems. If necessary in this context, the control windings 21 to 28, or some of them, can be electrically interconnected such that the amount of current running through the resistive circuit thereby created further promotes compensation for eddy currents generated in the conductive surfaces of the magnet system.

Still further, it is known that a superconducting magnet system is required to safely dissipate its entire stored energy should one or more of the superconducting coils become resistive during operation, thus promoting a quench event. This can be achieved by propagating the quench events from the coil or coils in which the resistance disturbance originated to all (or at least several) of the magnet coils, so dissipating the magnet energy more widely. This leads to a rapid quench, and avoids excessive temperature rises in any one coil. Ideally, the dissipation is effected throughout the whole magnet rather than in one or a few coils. If the quench is not so propagated, the coils which initially become resistive may build up damaging heat loads or voltages across themselves which may permanently damage the magnet and prevent it from returning to field. Again it is typical to address this problem individually, and a typical quench propagation circuit consists of discrete heater elements applied to the inner or outer surfaces of the magnet coils; the heaters being rapidly energized in response to the occurrence of a quench event to produce a thermal load on some or all of the magnet coils to cause them to become non-superconducting.

In accordance with this embodiment of the invention, the control windings 21 to 28 are interconnected electrically in series to create a complete resistive circuit which is connected as shown at 30 and 32 across a subset of the magnet coils of the superconducting magnet driver circuit 34, via a crossed diode thresholding circuit 36 provided to prevent current running through the interconnected coil circuit during normal magnet ramp up or ramp down. During a quench event, resistance appears in the magnet current path and a voltage appears across the resistive circuit which allows part of the magnet current to run through the over-bound control windings 21 to 28 which are formed of resistive wire. This current in the resistive wire causes ohmic heating, which initiates quenching of the superconducting magnet coils, thus providing a quench propagation circuit.

It will be appreciated that the aforementioned electrical interconnection of the control windings 21 to 28 may be made either serially (as shown in the drawing) or in parallel or in a series/parallel combination, depending upon the extent and effect required of the quench distribution circuit. Moreover, whichever interconnection technique is employed, one or more of the control windings may be omitted from the interconnection if desired.

This embodiment of the invention thus provides an integrated solution to all three problems, whereby the over-binding of the control windings 21 to 28 onto the superconducting magnet coils 11 to 18 provides mechanical retention of the magnet coils onto their former, and also provides components of a quench propagation circuit, along with a substitute for the quench bands that are typically used for field burst prevention.

Figure 2:
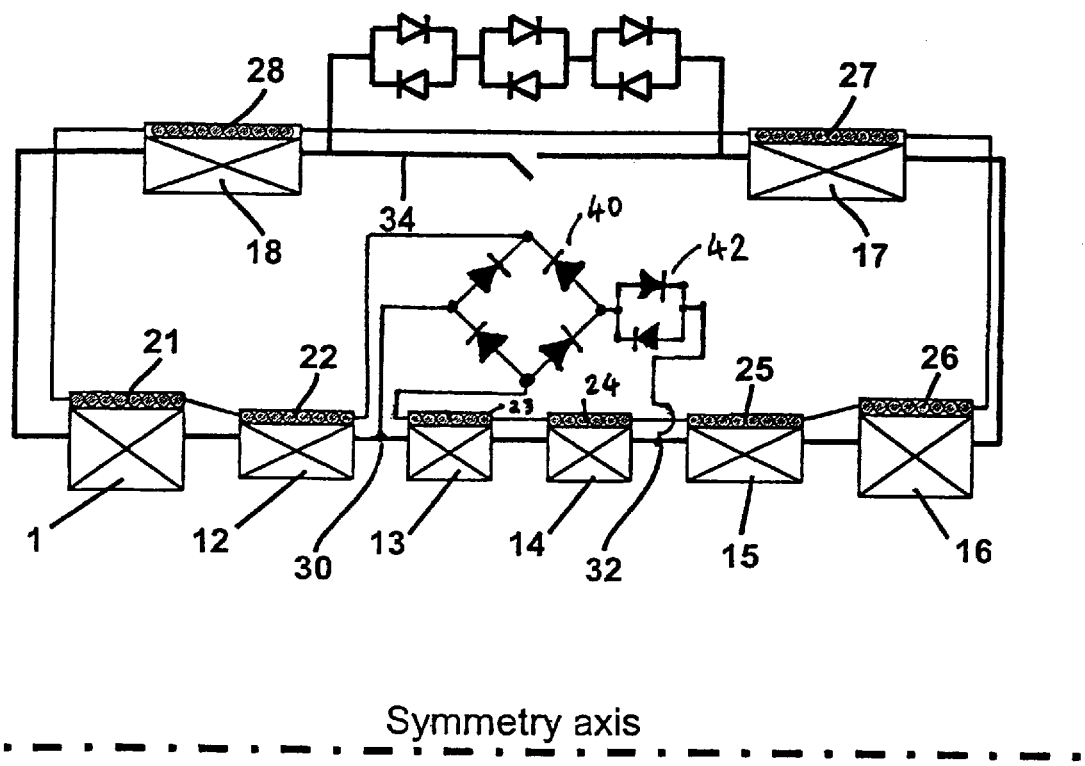
FIG. 2 shows schematically and in cross-sectional view a portion of a coil arrangement incorporating a control system in accordance in one embodiment of the invention.

As illustrated in FIG. 2, it may be necessary to ensure that current flowing in the control windings 21-28 will always flow in a certain direction, regardless of which of coils 11-18 is the first to quench. This may be particularly the case where currents in the control windings serve to compensate for the magnetic effects of eddy currents in other parts of the magnet system. In order to ensure such direction of current flow in the control windings, as illustrated in FIG. 2, the thresholding ciode arrangenent 42 may be provided in series with the diode bridge 40, if the threshold of the diodes of the bridge 40 is in sufficient.

Thus, in summary, an integrated approach to addressing several problems usually addressed individually is provided, wherein a predetermined number of turns and layers of a resistive, typically aluminium, wire are applied to the outer surface of some or all of the superconducting magnet coils. The over-binding provides sufficient thermal strain, due to different coefficients of thermal expansion, to create a negative hoop stress on the magnet coils, thus compensating for both the positive hoop stress due to the difference in thermal contraction of magnet coil and former and the positive hoop stress of the Lorentz force due to the background magnetic field.

Moreover, the individual resistive coils of the over-binding wire are preferably interconnected in series or in parallel, or in a combination of the two, to create a resistive heater circuit of an appropriate total resistance to provide sufficient heating to the superconducting coils during a quench to ensure that the magnet energy is dissipated through an adequate number of magnet coils to ensure the magnet survives a quench event.

Still further, the number of turns and layers of the resistive circuit are preferably arranged to accommodate a solution for cancelling magnetic field burst due to eddy currents in the conductive magnet surfaces, by allowing sufficient current to flow through the resistive circuit to create an opposing magnetic field.

A further embodiment allows for the over-binding to be replaced by similar under-binding, useful for coils that experience negative hoop stress due to the Lorentz force of the background magnetic field.

The over-bound control coils may be used to provide coil clamping and quench propagation without also being used to provide a quench band substitute.

The over-bound control coils may be used to provide coil clamping and quench propagation without also being used to provide a quench propagation circuit.

As described, embodiments of the present invention provide the use of resistive wire, such as aluminum wire, overbound on top of superconducting coils, to provide the following functions.

1) Restraining differential thermal contraction as between coils and formers: the over-binding has a larger coefficient of thermal expansion than the coil, so that the over-binding becomes tighter as the magnet cools, preventing the coil from becoming loose on its former. This feature addresses a problem which is of particular importance when an aluminum former is used, or one of any material which has a larger coefficient of thermal expansion than the coil. This feature is also useful in restraining Lorenz forces which may tend to expand the magnet coil away from its former.

2) Resisting magnetic field expansion associated with quenching of operational magnetic field. The over-binding coils are electrically connected across a subset of the magnet coils and are dimensioned and configured such that the amount of curent running through the resistive circuit will generate a magnetic field to compensate for the magnetic field produced by eddy currents generated in conductive surfaces of the magnet system, similar to the effect of known quench bands.

3) Automatic localized heating, responsive to a quench event, so as to distribute the quench and protect the magnt coils. The over-bindings are electically connected across a subset of the magnet coils to cause heating to receive a current due to a voltage developed across quenching coils in response to the onset of a quench event.

Although modifications and changes may be suggested by those skilled in the art, it is the intention of the inventor to embody within the patent warranted hereon all chanes and modifications as reasonably and properly come within the scope of his contribution to the art.

I claim as my invention:

1. A cryogenic magnet control system comprising:
   a plurality of magnet coils, each magnet coil comprising a former and a superconduting conductor would on said former and control windings of a non-superconducting material provided as over-bindings on the superconducting conductor of the magnet coil;
   a supply connected to said magnet coils for operating the magnetic coils to generate, in combination, an operational magnetic field of a predetermined strength and homogeneity;
   each control winding being formed of a material having a coefficient of thermal expansion of the magnet coil on which the control winding is ound, to restrain differential expansion between the magnet coil and the former thereof;
   said control windings being configured and dimensioned to produce eddy currents that oppose magnetic field expansion caused by eddy currents in a remainder of a magnetic formed by said magnet coils, said eddy currents occurring upon quenching of said operational magnetic field; and on at least some of said magnet coils, forming a subset of said plurality of magnetic coils, the respective control windings thereof being electically interconnected and the respective control windings of the magnet coils in said subset of magnet coils being interconnected with each other, and a control circuit that generates electrical current through the interconnected control windings of said subset of magnet coils in response to an onset of a quench, to automatically provide localized heating of the magnet coils in said subset of said magnet coils in response to said quench, to distribute the quench among said subset of magnet coils.

2. A system claimed in claim 1, wherein the respective control windings of the magnet coils in said subset of magnet coils are electically interconnected in series.

3. A system as claimed in claim 1 wherein the respective control windings of the magnet coils in said subset of magnet coils are electrically interconnected in parallel.

4. A system as claimed in claim 1 wherein the respective control windings of the magnet coils in said subset of magnet coils are electrically interconnected in a series-parallel combination.

5. A system according to claim 1, wherein said control circuit comprises a cross-connected diode thresholding circuit.

6. A system according to claim 1, wherein at least some of said winding are formed by aluminum wire.

* * * * *